United States Patent
Kao et al.

(10) Patent No.: US 10,102,916 B1
(45) Date of Patent: Oct. 16, 2018

(54) FLASH MEMORY DEVICE HAVING ABNORMAL POWER PROTECTION

(71) Applicant: Innodisk Corporation, New Taipei (TW)

(72) Inventors: Chih-Chieh Kao, New Taipei (TW); Yueh-Feng Tsai, New Taipei (TW)

(73) Assignee: INNODISK CORPORATION, New Taipei (TW)

( * ) Notice: Subject to any disclaimer, the term of this patent is extended or adjusted under 35 U.S.C. 154(b) by 0 days.

(21) Appl. No.: 15/705,754

(22) Filed: Sep. 15, 2017

(30) Foreign Application Priority Data

May 22, 2017 (TW) ............................. 106116840 A

(51) Int. Cl.
  *G11C 5/14* (2006.01)
  *G11C 16/34* (2006.01)
  *G11C 16/30* (2006.01)

(52) U.S. Cl.
  CPC .......... *G11C 16/3418* (2013.01); *G11C 16/30* (2013.01)

(58) Field of Classification Search
  CPC .................................................... G11C 16/30
  USPC ............................................ 365/185.18, 226
  See application file for complete search history.

(56) References Cited

U.S. PATENT DOCUMENTS

| 7,599,241 B2* | 10/2009 | Sprouse | G11C 16/225 365/206 |
| 8,042,013 B2* | 10/2011 | Eto | G11C 16/225 714/719 |
| 8,242,633 B2* | 8/2012 | Huang | G11C 16/22 307/109 |

* cited by examiner

*Primary Examiner* — Son Mai
(74) *Attorney, Agent, or Firm* — Chun-Ming Shih; HDLS IPR Services

(57) ABSTRACT

The invention provides a flash memory device, which comprises a controller, a plurality of flash memories, a switcher, a power supply module, and a voltage detection circuit. When the system voltage is higher than a voltage threshold, the voltage detection circuit outputs an enable signal to the switcher to turn on the switcher, the system voltage is provided to the power supply module, the power supply module executes a charging process by the system voltage, and generates an output voltage based on the system voltage. The output voltage is an operating voltage of the controller and the flash memories. When the system voltage is lower than the voltage threshold, the voltage detection circuit outputs a disable signal to the switcher to turn off the switcher, the system voltage is inhibited to provide to the power supply module, the power module generates the output voltage by executing a discharging process.

22 Claims, 4 Drawing Sheets

FLASH MEMORY DEVICE HAVING ABNORMAL POWER PROTECTION

This non-provisional application claims priority claim under 35 U.S.C. § 119 (a) on Taiwan Patent Application No. 106116840 filed May 22, 2017, the entire contents of which are incorporated herein by reference.

FIELD OF THE INVENTION

The present invention relates to a flash memory device, more particularly, to a flash memory device having abnormal power protection.

BACKGROUND

The boot failure of the flash memory device (such as SSD, SD card, CF card, USB flash drive) will be happening during the boot, because of the instability of the power supply. Besides, If the power off, the abnormal voltage, or the unstable voltage is suddenly occurred during the writing of data, the flash memory device will be unable to successfully write to the flash memory due to the loss of the power supply or the voltage drop, resulting in the damage of data.

In order to avoid the power outage occurred during the data storage system performing the writing of important data (such as financial data), the data storage device can additional configure a capacitor module (such as super capacitor) capable of providing a backup energy. When the power outage occurs, the required work power that the data storage device performs the writing of data can be provided by the discharging of the capacitor module. However, if the computer host restarts the power of the flash memory device in advance before the energy stored in the capacitor module is completely discharged, the controller of the flash memory device will ignore an initial command, transmitted from the computer host, for restarting the system of the flash memory device, since the flash memory device continues to receive the discharge energy of the capacitor module, resulting in an abnormal voltage level existed in the flash memory device, such that the restarting of the system of the flash memory will be failed, and therefore the computer host can not access the flash memory device.

SUMMARY

It is one object of the present invention to provide a flash memory device having abnormal power protection, wherein the flash memory device detects a system voltage provided by a computer host by a voltage detection circuit. The voltage detection circuit outputs an enable signal to allow the system voltage to be provided to the flash memory device when the system voltage is higher than a voltage threshold. On the contrary, the voltage detection circuit outputs a disable signal to inhibit the system voltage to provide to the flash memory device when the system voltage is lower than the voltage threshold.

It is another object of the present invention to provide a flash memory device having abnormal power protection, wherein the flash memory device is configured with a power supply module, a discharged energy provided by the power supply module can be used for compensating the shortage of the system voltage, so that the working voltage of the flash memory device can be maintained at a stable voltage level.

It is another object of the present invention to provide a flash memory device having abnormal power protection, wherein the voltage detection circuit of the flash memory device is configured with a delay restarting power function. When the system voltage returns to higher than the voltage threshold from lower than the voltage threshold, the voltage detection circuit is able to delay the time of restarting power, so that the computer host can successfully perform a system restarting process for the flash memory device after an energy stored in the power supply module has completely discharged or a residual voltage of the power supply module has reached the minimum allowable value.

It is another object of the present invention to provide a flash memory device having abnormal power protection, wherein the flash memory device is provided with a controller having a firmware, the firmware defines at least one starting condition of abnormal power protection. When the system voltage is lower than the voltage threshold, the firmware can further determine whether the system voltage is conforming to the starting condition of abnormal power protection, and therefore decide whether the abnormal power protection is started, thereby it will prevent that the flash memory device is repeatedly performing the abnormal voltage protection in a short period of time, thereby improving the stability of the flash memory device in the operation.

To achieve the above object, the present invention provides a flash memory device having abnormal power protection, comprising: a controller; a plurality of flash memories; a switcher used for receiving a system voltage; a power supply module, connected to the controller, the flash memories, and the switcher, respectively, and used for generating an output voltage and transmitting the output voltage to the controller and the flash memories; and a voltage detection circuit, connected to the switcher, and used for detecting the system voltage, when the system voltage is higher than a voltage threshold, the voltage detection circuit outputs an enable signal to the switcher to turn on the switcher, the system voltage is provided to the power supply module via the switcher, the power supply module executes a charging process by the system voltage, and generates the output voltage based on the system voltage; when the system voltage is lower than the voltage threshold, the voltage detection circuit outputs a disable signal to the switcher to turn off the switcher, the system voltage is inhibited to provide to the power supply module, the power supply module executes a discharging process so as to generate the output voltage; when the system voltage returns to higher than the voltage threshold from lower than the voltage threshold, the voltage detection circuit outputs the enable signal to the switcher after a delay time so as to turn on the switcher again, the system voltage is re-provided to the power supply module via the switcher, wherein before the voltage detection circuit re-outputs the enable signal, an energy stored in the power supply module has completely discharged or a residual voltage of the power supply module has reached a minimum allowable value.

In one embodiment of the present invention, wherein the voltage detection circuit is configured with a delay restarting power function, the delay time is defined in the delay restarting power function.

In one embodiment of the present invention, wherein the delay restarting power function can define the delay time based on a stored electrical quantity of the power supply module.

In one embodiment of the present invention, wherein the flash memory device is connected to a computer host, the system voltage is provided by the computer host, when the system voltage has returned to higher than the voltage threshold from lower than the voltage threshold and the voltage detection circuit has re-outputted the enable signal, the computer host will issue a system restarting command to the controller of the flash memory device so as to restart a system inside the flash memory device.

In one embodiment of the present invention, wherein when the switcher is turned off, the controller will execute a data backup process, by a discharge energy of the power supply module, thereby at least one data can be backed up to the flash memories.

In one embodiment of the present invention, wherein the flash memory device is connected to a computer host, the system voltage is provided by the computer host, when the computer host is powered on for the first time, the voltage detection circuit will output the enable signal to the switcher if the system voltage is higher than the voltage threshold, the computer host is allowed to execute a booting process for the flash memory device; otherwise, when the computer host is powered on for the first time, the voltage detection circuit will output the disable signal to the switcher if the system voltage is lower than the voltage threshold, the computer host is unable to execute the booting process for the flash memory device.

In one embodiment of the present invention, wherein the voltage detection circuit comprises: a voltage comparator for outputting a first signal with high-level or low-level according to a comparison result between the system voltage and the voltage threshold; and an OR gate comprising a first input end connected to the voltage comparator, a second input end connected to the controller, and an output end connected to the switcher, wherein the controller is able to output a second signal with high-level or low-level to the OR gate, the OR gate outputs the enable signal or the disable signal based on the first signal and the second signal.

In one embodiment of the present invention, wherein the controller comprises a general purpose input and output port, which is connected to the second input end of the OR gate.

In one embodiment of the present invention, wherein the voltage comparator is a comparator having the delay restarting power function, when the system voltage returns to higher than the voltage threshold from lower than the voltage threshold, the voltage comparator will output the first signal with high-level to the OR gate after the delay time.

In one embodiment of the present invention, wherein the power supply module comprises a boost converter, a buck converter, and at least one storage element, the storage element is connected between the boost converter and the buck converter, the boost converter is able to pull up the system voltage to generate a first high voltage, the storage element is charged by the first high voltage, the buck converter is able to pull down the first high voltage to generate the output voltage.

The present invention further provides a flash memory device having abnormal power protection, comprising: a controller configured with a firmware that is for defining at least one starting condition of abnormal power protection; a plurality of flash memories; a switcher used for receiving a system voltage; a power supply module, connected to the controller, the flash memories, and the switcher, respectively, and used for generating an output voltage and transmitting the output voltage to the controller and the flash memories; a voltage detector, used for receiving the system voltage, and connected to the controller, wherein the controller is able to detect the system voltage by the voltage detector; and a voltage detection circuit, connected to the switcher, and used for detecting the system voltage, when the system voltage is higher than a voltage threshold, or does not conform the starting condition of abnormal power protection, the controller outputs a second signal with high-level to the voltage detection circuit, the voltage detection circuit outputs an enable signal to the switcher to turn on the switcher, the system voltage is provided to the power supply module via the switcher, the power supply module executes a charging process by the system voltage, and generates the output voltage based on the system voltage; when the system voltage is lower than the voltage threshold and simultaneous conforms the starting condition of abnormal power protection, the controller outputs a second signal with low-level to the voltage detection circuit, the voltage detection circuit outputs a disable signal to the switcher to turn off the switcher, the system voltage is inhibited to provide to the power supply module, the power supply module executes a discharging process so as to generate the output voltage.

In one embodiment of the present invention, wherein the abnormal power protection is started by the firmware of the controller when the occurrence number of times that are the system voltage drifted below the voltage threshold are more than a predetermined number of times in a predetermined time.

In one embodiment of the present invention, wherein the abnormal power protection is started by the firmware of the controller when a continuous time that are the system voltage below the voltage threshold is more than a predetermined time

DETAILED DESCRIPTION OF THE PREFERRED EMBODIMENTS

Figure 1:
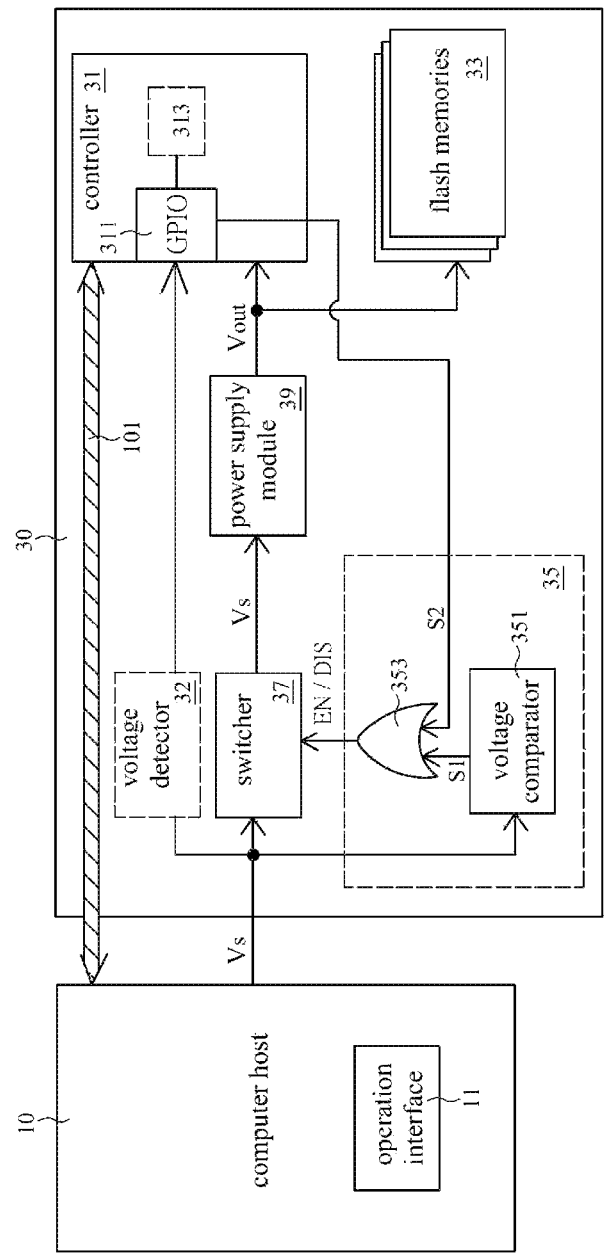
FIG. 1 is a circuit block diagram of the flash memory device according to one embodiment of the present invention.
Figure 2:
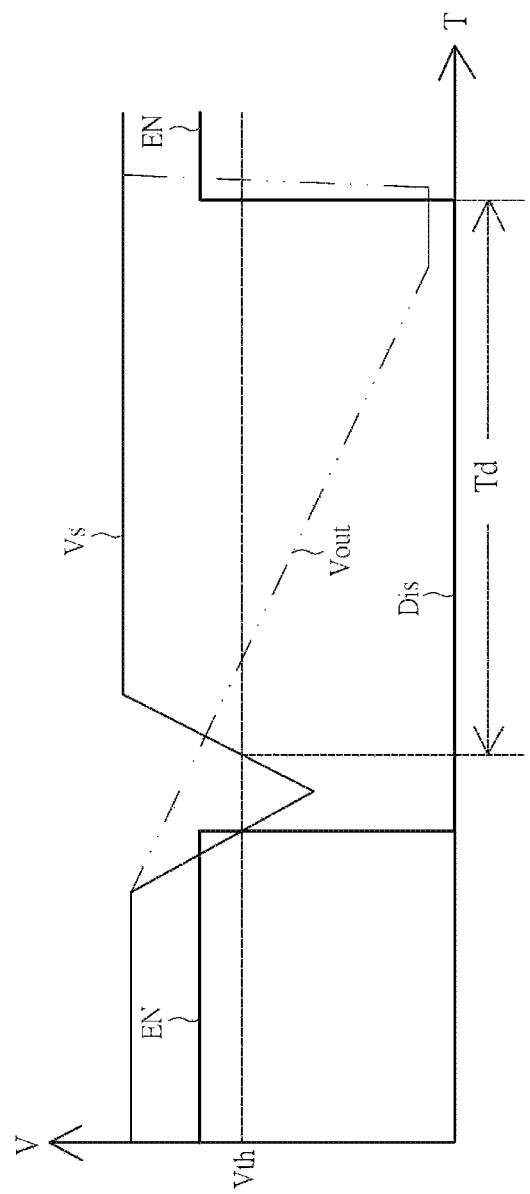
FIG. 2 is a state diagram of the operation of the flash memory device according to one embodiment of the present invention.

Referring to FIG. 1 and FIG. 2, there are shown a circuit block diagram of the flash memory device according to one embodiment of the present invention, and a state diagram of the operation of the flash memory device according to one embodiment of the present invention. As shown in FIG. 1, the flash memory device 30 is connected to a computer host 10, and transmitting data with the computer host 10 by a transmission interface 101. The transmission interface 101 is a data transmission interface conforming to USB interface standard protocol, PCIe interface standard protocol, SATA 3 interface standard protocol or other interface standard protocol. The computer host 10, by the transmission interface 101, is able to execute the data access for the flash memory device 30, or control the operation of the flash memory device 30.

The flash memory device 30 comprises a controller 31, a plurality of flash memories 33, a voltage detection circuit 35, a switcher 37, and a power supply module 39. The switcher 37 is connected to the voltage detection circuit 35 and the power supply module 39. The controller 31 and the flash memories 33 are connected to the power supply module 39, respectively. The controller 31 is connected to the voltage detection circuit 35 by a GPIO (General-Purpose Input/Output) 311.

The computer host 10 outputs a system voltage (Vs) to the flash memory device 30 so as to provide the work energy that is required by the operation of the flash memory device 30. When the voltage detection circuit 35 of the flash memory device 30 receives the system voltage (Vs), it will detect whether the system voltage (Vs) is lower than a voltage threshold (Vth). In the present invention, the voltage threshold (Vth) is a minimum working voltage in the normal operation of the flash memory device 30.

As shown in FIG. 2, when the system voltage (Vs) is higher than the voltage threshold (Vth), the voltage detection circuit 35 will output an enable signal (EN) to the switcher 37 to turn on the switcher 37, so that the system voltage (Vs) is provided to the power supply module 39 by the turning on of the switcher 37. Afterwards, the power supply module 39 executes a charging process by the system voltage (Vs), generates an output voltage (Vout) based on the system voltage (Vs), and transmits the output voltage (Vout) to the controller 31 and the flash memories 33. The output voltage (Vout) is the working voltage of the controller 31 and the flash memories 33.

When the system voltage (Vs) is lower than the voltage threshold (Vth), the voltage detection circuit 35 will output a disable signal (DIS) to the switcher 37 to turn off the switcher 37, the system voltage (Vs) is inhibited to provide to the power supply module 39. Afterwards, the power supply module 39 executes a discharging process to generate the output voltage (Vout), and transmits the output voltage (Vout) generated by the discharging to the controller 31 and the flash memories 33. At the same time, the controller 31 will immediately execute a data backup process to back up the important data into the flash memories 33 as soon as possible before the output voltage (Vout) generated by the discharging is still higher than the voltage threshold (Vth), so that the loss of the important data can be avoided. In the present invention, the time at which the controller 31 can perform the data backup is started from the disable signal (DIS) issued by the voltage detection circuit 35 until the output voltage (Vout) generated by the discharging has been lower than the voltage threshold (Vth).

Continuously, when the system voltage (Vs) returns to higher than the voltage threshold (Vth) from lower than the voltage threshold (Vth), the computer host 10 can execute a system restarting process for the flash memory device 30 to restart the system of the flash memory device 30. However, the restarting of the system of the flash memory device 30 will fail if the energy stored in the power supply module 39 has not yet been completely discharged or a residual voltage of the power supply module 39 has not yet been reached a minimum allowable value accepted by the system. Accordingly, the voltage detection circuit 35 is configured with a delay restarting power function, which is for delaying the time of restarting power of the flash memory device 30, so that the computer host 10 can execute the system restarting process for the flash memory device 30 after the energy stored in the power supply module 39 has completely discharged or the residual voltage of the power supply module 39 has reached the minimum allowable value accepted by the system. In the present invention, a delay time (Td) will be defined in the delay restarting power function of the voltage detection circuit 35.

The operation process of the delay restarting power function as follows: when the system voltage (Vs) returns to higher than the voltage threshold (Vth) from lower than the voltage threshold (Vth), the voltage detection circuit 35 will output the enable signal (EN) to the switcher 37 after the delay time (Td) by the execution oof the delay restarting power function, so as to turn on the switcher 37 again, and therefore make the system voltage (Vs) to be re-powered to the flash memory device 30 by the turning on of the switcher 37. The voltage detection circuit 35 can correspondingly define the delay time (Td) based on a stored electrical quantity of the power supply module 39, for example, the stored electrical quantity of the power supply module 39 is greater, the delay time (Td) of the delay restarting power function will be correspondingly defined as longer time, in such a way that before the power of the flash memory device 30 is restarted, the energy stored in the power supply module 39 has completely discharged or the residual voltage of the power supply module 39 has reached the minimum allowable value.

Furthermore, the computer host 10 will issue a system restarting command to the controller 31 of the flash memory device 30 when the energy stored in the power supply module 39 has completely discharged or the residual voltage of the power supply module 39 has reached the minimum allowable value, the controller 31 can successfully restart the system of the flash memory device 30 according to the system restarting command.

Accordingly, the abnormal power protection can be started by the voltage detection circuit 35 when the system voltage (Vs) is lower than the voltage threshold (Vth) due to the suddenly poweroff or the larger voltage amplitude, so as to avoid the flash memory device 30 to be operated in an abnormal power supply environment, and ensure the reliability of the flash memory device 30 in data access. Besides, the flash memory device 30 can only the system restarting after the energy stored in the power supply module 39 has completely discharged or the residual voltage of the power supply module 39 has reached the minimum allowable value, so as to ensure that the system of the flash memory device 30 can be successfully restarted.

Figure 3:
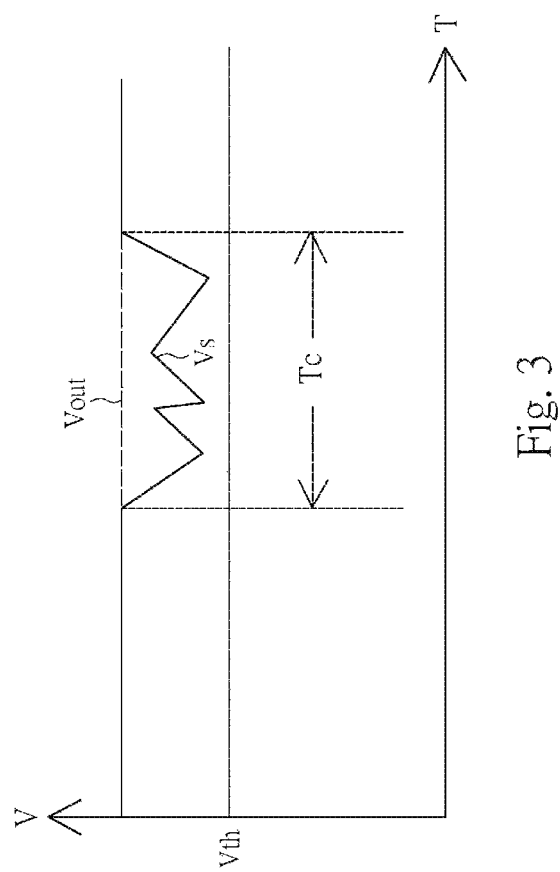
FIG. 3 is a waveform diagram of a system voltage and an output voltage of the flash memory device according to one embodiment of the present invention.

Referring to FIG. 3, there is shown a waveform diagram of a system voltage and an output voltage of the flash memory device according to one embodiment of the present invention, and simultaneously referring to FIG. 1. The tolerance of the flash memory device is generally specification of ±5% for the flutter amplitude of the system voltage (Vs) provided by the computer host 10. If the drop amplitude of the system voltage (Vs) is more than −5%, the value of the system voltage (Vs) may be lower than the voltage threshold (Vth), resulting in the flash memory device 30 being unable to operate normally. Therefore, the flash memory device 30 is further configured with the power supply module 39. When the system voltage (Vs) is fluttering, a discharged energy provided by the power supply module 39 can be used for compensating the shortage of the system voltage (Vs), so that the output voltage (Vout) generated by the power supply module 39 can be maintained at a stable voltage level, and therefore the controller 31 and the flash memories 33 can keep in a normal operation. As shown in FIG. 3, the system voltage (Vs) is fluttering during Tc, the discharged energy of the power supply module 39 can be used for compensating the shortage of the system voltage (Vs), so that the output voltage (Vout) generated by the power supply module 39 can be maintained at a stable voltage level. Accordingly, by the disposition of the power supply module 39, the flash memory device 30 tolerates the drop amplitude of the system voltage (Vs) that can be more than −5%.

Referring to FIG. 1 again, the voltage detection circuit 35 comprises a voltage comparator 351 and an OR gate 353. The OR gate 353 comprises a first input end connected to the voltage comparator 351, a second input end connected to the GPIO 311 of the controller 31, and an output end connected to the switcher 37. The voltage comparator 351 outputs a first signal S1 with high-level or low-level to the OR gate 353 according to a comparison result between the system voltage (Vs) and the voltage threshold (Vth). The controller 31 outputs a second signal S2 with high-level or low-level to the OR gate 353 via the GPIO 311. The OR gate 353 outputs the enable signal (EN) or the disable signal (DIS) according to the levels of the first signal S1 and the second signal S2.

In one embodiment of the present invention, the second signal S2 is preset as a low-level signal by the controller 31. When the computer host 10 is powered on for the first time, the voltage comparator 351 of the voltage detection circuit 35 compares whether the system voltage (Vs) is higher than the voltage threshold value (Vth). If the system voltage (Vs) is lower than the voltage threshold value (Vth), the voltage comparator 351 outputs the first signal S1 with low-level, the OR gate 353 outputs a disable signal (DIS) to the switcher 37 according to the first signal S1 with low-level and the second signal S2 with low-level, so as to inhibit the system voltage (Vs) to provide to the flash memory device 30, and prevent the computer host 10 to perform the booting up for the flash memory device 30. On the contrary, if the system voltage (Vs) is higher than the voltage threshold value (Vth), the voltage comparator 351 outputs the first signal S1 with high-level, the OR gate 353 outputs an enable signal (EN) to the switcher 37 according to the first signal S1 with high-level and the second signal S2 with low-level, so that the system voltage (Vs) can be provided to the flash memory device 30, and the computer host 10 can perform the booting up for the flash memory device 30.

When the flash memory device 30 has completed the booting up and executed the operating, the voltage detection circuit 35 continues to detect whether the system voltage (Vs) is abnormal. When the voltage detection circuit 35 detects that the system voltage (Vs) is higher than the voltage threshold value (Vth), it will output the first signal S1 with high-level, such that the OR gate 353 outputs the enable signal (EN) to the switcher 37 according to the first signal S1 with high-level and the second signal S2 with low-level, the system voltage (Vs) is provided to the internal circuit (such as the controller 31 and the flash memories 33) of the flash memory device 30 via the switcher 37, and the flash memory device 30 is operated in a normal operation state. When the voltage detection circuit 35 detects that the system voltage (Vs) is lower than the voltage threshold value (Vth), it will output the first signal S1 with low-level, such that the OR gate 353 outputs the disable signal (DIS) to the switcher 37 according to the first signal S1 with low-level and the second signal S2 with low-level, the system voltage (Vs) is inhibited to provide to the internal circuit of the flash memory device 30, and the flash memory device 30 is operated in an abnormal power protection state. In the present embodiment, the voltage detection circuit 35 determines whether the abnormal power protection is started.

The voltage comparator 351 of the present invention is a comparator having a delay function, for example, the internal circuit of the voltage comparator 351 is configured with at least one buffer gate. When the system voltage (Vs) returns to higher than the voltage threshold (Vth) from lower than the voltage threshold (Vth), the voltage comparator 351 of the voltage detection circuit 35 will execute the delay restarting power function to delay the time of restarting power; afterwards, waiting for the energy stored in the power supply module 39 to be completely discharged or the residual voltage of the power supply module 39 to be reached the minimum allowable value, the voltage comparator 351 of the voltage detection circuit 35 will output the enable signal (EN) to the OR gate 353 so that the OR gate 353 outputs the enable signal (EN) to turn on the switcher 37, thereby the system voltage (Vs) can be re-powered to the flash memory device 30. Accordingly, the system of the flash memory device 30 can be only restarted after the energy stored in the power supply module 39 has completely discharged or the residual voltage of the power supply module 39 has reached the minimum allowable value, so as to ensure that the system of the flash memory device 30 can be successfully restarted.

In another embodiment of the present invention, the flash memory device 30 further comprises a voltage detector 32, and the controller 31 is further configured with a firmware 313. The controller 31 detects the voltage value of the system voltage (Vs) by the GPIO 311. The firmware 313 is used for defining at least one starting condition of abnormal power protection, for example, the occurrence number of times that are the system voltage (Vs) drifted below the voltage threshold (Vth) are more than a predetermined number of times in a predetermined time; or, the continuous time that is the system voltage (Vs) below the voltage threshold (Vth) is more than a predetermined time.

In the present embodiment, similarly, the voltage detection circuit 35 compares whether the system voltage (Vs) is higher than the voltage threshold value (Vth), when the computer host 10 is powered on for the first time. If the system voltage (Vs) is lower than the voltage threshold value (Vth), the voltage detection circuit 35 will directly output the disable signal (DIS) to inhibit the booting up of the flash memory device 30. On the contrary, if the system voltage (Vs) is higher than the voltage threshold value (Vth), the voltage detection circuit 35 will output the enable signal (EN) to allow the booting up of the flash memory device 30. After the flash memory device 30 is successfully booted up, whether or not the abnormal voltage protection is started will be decided by the firmware 313. In other words, the firmware 313 can determine whether the system voltage (Vs) is conforming to the starting condition of abnormal power protection.

When the system voltage (Vs) is lower than the voltage threshold value (Vth), the firmware 313 will determine whether the system voltage (Vs) is conforming to the starting condition of abnormal power protection. If the firmware 313 determines that the system voltage (Vs) isn't conforming to the starting condition of abnormal power protection, the controller 31 continues to output the second signal S2 with high-level, the flash memory device 30 is operated in the normal state. On the contrary, if the firmware 313 determines that the system voltage (Vs) is conforming to the starting condition of abnormal power protection, the controller 31 outputs the second signal S2 with low-level, then the OR gate 353 outputs the disable signal (DIS) to the switcher 37 according to the first signal S1 with low-level and the second signal S2 with low-level, such that the abnormal power protection is started, the system voltage (Vs) is inhibited to provide to the internal circuit of the flash memory device 30, the flash memory device 30 is operated in the abnormal power protection state.

As the above described, the flash memory device 30 of the present invention detects whether the system voltage Vs is conforming to the starting condition of abnormal power protection by the firmware 313, such that it will prevent that the switcher 37 is continuously switched in a short period of time, and therefore improve the efficiency of the flash memory device 30 in the operation. Besides, by the disposition of the power supply module 39, the shortage of the system voltage (Vs) in the short period can be compensated by the discharge energy of the power supply module 39. Accordingly, the flash memory device 30 of the present invention does not need to start the abnormal power protection during a short abnormal voltage, thereby improving the stability of the flash memory device 30 in the operation. Furthermore, the computer host 10 of the present invention further comprises an operation interface 11. The user can select whether the firmware is involved in the abnormal power protection by the operation of the operation interface 11.

Figure 4:
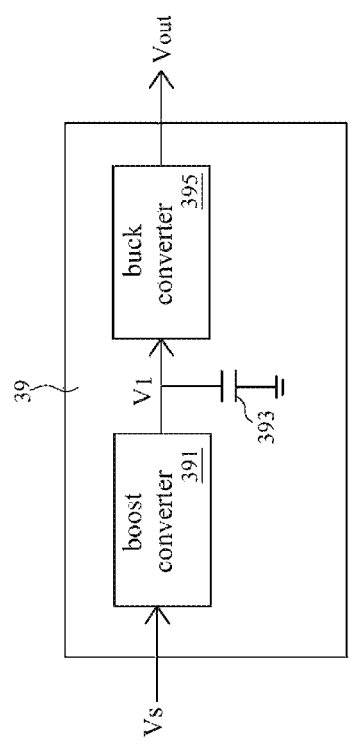
FIG. 4 is a circuit structural diagram of the power supply module according to one embodiment of the present invention.

In one embodiment of the present invention, the power supply module 39 is consisted of at least one storage energy element, for example, super capacitor. When the power supply module 39 receives the system voltage (Vs), the power supply module 39 directly charges for the storage energy element by the system voltage (Vs), and generates the output voltage (Vout). In another embodiment of the present invention, the power supply module 39 comprises a boost converter 391, at least one storage energy element 393, and a buck converter 395, as shown in FIG. 4. The storage energy element 393 is connected between the boost converter 391 and the buck converter 395. The boost converter 391 pulls up the system voltage (Vs) to generate a first high voltage $V_1$. The storage energy element 393 is charged by the first high voltage $V_1$. The buck converter 395 pulls down the first high voltage $V_1$ to generate the output voltage (Vout). Thus, the charging of the energy storage element 393 is performed by a higher voltage so that the charging speed of the storage energy element 393 can be accelerated.

The above disclosure is only the preferred embodiment of the present invention, and not used for limiting the scope of the present invention. All equivalent variations and modifications on the basis of shapes, structures, features and spirits described in the claims of the present invention should be included in the claims of the present invention.

The invention claimed is:

1. A flash memory device having abnormal power protection, comprising:
 a controller;
 a plurality of flash memories;
 a switcher used for receiving a system voltage;
 a power supply module, connected to the controller, the flash memories, and the switcher, respectively, and used for generating an output voltage and transmitting the output voltage to the controller and the flash memories; and
 a voltage detection circuit, connected to the switcher, and used for detecting the system voltage, when the system voltage is higher than a voltage threshold, the voltage detection circuit outputs an enable signal to the switcher to turn on the switcher, the system voltage is provided to the power supply module via the switcher, the power supply module executes a charging process by the system voltage, and generates the output voltage based on the system voltage; when the system voltage is lower than the voltage threshold, the voltage detection circuit outputs a disable signal to the switcher to turn off the switcher, the system voltage is inhibited to provide to the power supply module, the power supply module executes a discharging process so as to generate the output voltage;
 when the system voltage returns to higher than the voltage threshold from lower than the voltage threshold, the voltage detection circuit outputs the enable signal to the switcher after a delay time so as to turn on the switcher again, the system voltage is re-provided to the power supply module via the switcher, wherein before the voltage detection circuit re-outputs the enable signal, an energy stored in the power supply module has completely discharged or a residual voltage of the power supply module has reached a minimum allowable value.

2. The flash memory device according to claim 1, wherein the voltage detection circuit is configured with a delay restarting power function, the delay time is defined in the delay restarting power function.

3. The flash memory device according to claim 2, wherein the delay restarting power function can define the delay time based on a stored electrical quantity of the power supply module.

4. The flash memory device according to claim 1, wherein the flash memory device is connected to a computer host, the system voltage is provided by the computer host, when the system voltage has returned to higher than the voltage threshold from lower than the voltage threshold and the voltage detection circuit has re-outputted the enable signal, the computer host will issue a system restarting command to the controller of the flash memory device so as to restart a system inside the flash memory device.

5. The flash memory device according to claim 1, wherein when the switcher is turned off, the controller will execute a data backup process, by a discharge energy of the power supply module, thereby at least one data can be backed up to the flash memories.

6. The flash memory device according to claim 1, wherein the flash memory device is connected to a computer host, the system voltage is provided by the computer host, when the computer host is powered on for the first time, the voltage detection circuit will output the enable signal to the switcher if the system voltage is higher than the voltage threshold, the computer host is allowed to execute a booting process for the flash memory device; otherwise, when the computer host is powered on for the first time, the voltage detection circuit will output the disable signal to the switcher if the system voltage is lower than the voltage threshold, the computer host is unable to execute the booting process for the flash memory device.

7. The flash memory device according to claim 1, wherein the voltage detection circuit comprises:
 a voltage comparator for outputting a first signal with high-level or low-level according to a comparison result between the system voltage and the voltage threshold; and
 an OR gate comprising a first input end connected to the voltage comparator, a second input end connected to the controller, and an output end connected to the switcher, wherein the controller is able to output a second signal with high-level or low-level to the OR gate, the OR gate outputs the enable signal or the disable signal based on the first signal and the second signal.

8. The flash memory device according to claim 7, wherein the controller comprises a general purpose input and output port, which is connected to the second input end of the OR gate.

9. The flash memory device according to claim 7, wherein the voltage comparator is a comparator having the delay restarting power function, when the system voltage returns to higher than the voltage threshold from lower than the voltage threshold, the voltage comparator will output the first signal with high-level to the OR gate after the delay time.

10. The flash memory device according to claim 1, wherein the power supply module comprises a boost converter, a buck converter, and at least one storage element, the storage element is connected between the boost converter and the buck converter, the boost converter is able to pull up the system voltage to generate a first high voltage, the storage element is charged by the first high voltage, the buck converter is able to pull down the first high voltage to generate the output voltage.

11. A flash memory device having abnormal power protection, comprising:
   a controller configured with a firmware that is for defining at least one starting condition of abnormal power protection;
   a plurality of flash memories;
   a switcher used for receiving a system voltage;
   a power supply module, connected to the controller, the flash memories, and the switcher, respectively, and used for generating an output voltage and transmitting the output voltage to the controller and the flash memories;
   a voltage detector, used for receiving the system voltage, and connected to the controller, wherein the controller is able to detect the system voltage by the voltage detector; and
   a voltage detection circuit, connected to the switcher, and used for detecting the system voltage, when the system voltage is higher than a voltage threshold, or does not conform the starting condition of abnormal power protection, the controller outputs a second signal with high-level to the voltage detection circuit, the voltage detection circuit outputs an enable signal to the switcher to turn on the switcher, the system voltage is provided to the power supply module via the switcher, the power supply module executes a charging process by the system voltage, and generates the output voltage based on the system voltage; when the system voltage is lower than the voltage threshold and simultaneous conforms the starting condition of abnormal power protection, the controller outputs a second signal with low-level to the voltage detection circuit, the voltage detection circuit outputs a disable signal to the switcher to turn off the switcher, the system voltage is inhibited to provide to the power supply module, the power supply module executes a discharging process so as to generate the output voltage.

12. The flash memory device according to claim 11, wherein the abnormal power protection is started by the firmware of the controller when the occurrence number of times that are the system voltage drifted below the voltage threshold are more than a predetermined number of times in a predetermined time.

13. The flash memory device according to claim 11, wherein the abnormal power protection is started by the firmware of the controller when a continuous time that are the system voltage below the voltage threshold is more than a predetermined time.

14. The flash memory device according to claim 11, wherein the controller is connected to the voltage detector and for detecting the system voltage by a general purpose input and output port.

15. The flash memory device according to claim 11, wherein when the system voltage returns to higher than the voltage threshold from lower than the voltage threshold, the voltage detection circuit outputs the enable signal to the switcher after a delay time so as to turn on the switcher again, the system voltage is re-provided to the power supply module via the switcher; besides, before the voltage detection circuit re-outputs the enable signal, an energy stored in the power supply module has completely discharged or a residual voltage of the power supply module has reached a minimum allowable value.

16. The flash memory device according to claim 15, wherein the voltage detection circuit is configured with a delay restarting power function, the delay time is defined in the delay restarting power function.

17. The flash memory device according to claim 16, wherein the delay restarting power function can define the delay time based on a stored electrical quantity of the power supply module.

18. The flash memory device according to claim 15, wherein the flash memory device is connected to a computer host, the system voltage is provided by the computer host, when the system voltage has returned to higher than the voltage threshold from lower than the voltage threshold and the voltage detection circuit has re-outputted the enable signal, the computer host will issue a system restarting command to the controller of the flash memory device so as to restart a system inside the flash memory device.

19. The flash memory device according to claim 11, wherein when the switcher is turned off, the controller will execute a data backup process, by a discharge energy of the power supply module, thereby at least one data can be backed up to the flash memories.

20. The flash memory device according to claim 11, wherein the flash memory device is connected to a computer host, the system voltage is provided by the computer host, when the computer host is powered on for the first time, the voltage detection circuit will output the enable signal to the switcher if the system voltage is higher than the voltage threshold, the computer host is allowed to execute a booting process for the flash memory device; otherwise, when the computer host is powered on for the first time, the voltage detection circuit will output the disable signal to the switcher if the system voltage is lower than the voltage threshold, the computer host is unable to execute the booting process for the flash memory device.

21. The flash memory device according to claim 11, wherein the voltage detection circuit comprises:
   a voltage comparator for outputting a first signal with high-level or low-level according to a comparison result between the system voltage and the voltage threshold; and
   an OR gate comprising a first input end connected to the voltage comparator, a second input end connected to the controller, and an output end connected to the switcher, wherein the controller is able to output a second signal with high-level or low-level to the OR gate, the OR gate outputs the enable signal or the disable signal based on the first signal and the second signal.

22. The flash memory device according to claim 21, wherein the controller comprises a general purpose input and output port, which is connected to the second input end of the OR gate and the voltage detector.

* * * * *